(12) United States Patent
Iida et al.

(10) Patent No.: US 6,544,332 B1
(45) Date of Patent: Apr. 8, 2003

(54) METHOD FOR MANUFACTURING SILICON SINGLE CRYSTAL, SILICON SINGLE CRYSTAL MANUFACTURED BY THE METHOD, AND SILICON WAFER

(75) Inventors: Makoto Iida, Gunma (JP); Masanori Kimura, Gunma (JP); Hiroshi Takeno, Gunma (JP); Yoshinori Hayamizu, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/830,386

(22) PCT Filed: Aug. 30, 2000

(86) PCT No.: PCT/JP00/05873

§ 371 (c)(1), (2), (4) Date: Apr. 26, 2001

(87) PCT Pub. No.: WO01/16410

PCT Pub. Date: Mar. 8, 2001

(30) Foreign Application Priority Data

Aug. 30, 1999 (JP) .............................. 11-243961

(51) Int. Cl.$^7$ .............................. C30B 15/04
(52) U.S. Cl. .............................. 117/19; 117/20; 117/66; 117/73; 117/76; 117/930; 117/932
(58) Field of Search .............................. 117/2, 19, 20, 117/66, 73, 76, 930, 932

(56) References Cited

U.S. PATENT DOCUMENTS

| | | |
|---|---|---|
| 4,981,549 A | 1/1991 | Yamashita et al. |
| 5,935,320 A | 8/1999 | Graef et al. |
| 6,030,450 A | 2/2000 | Saishouji et al. |
| 6,042,646 A | 3/2000 | Ishikawa et al. |
| 6,071,341 A | 6/2000 | Shimanuki et al. |

FOREIGN PATENT DOCUMENTS

| | | |
|---|---|---|
| EP | 0 942 078 A1 | 9/1999 |
| EP | 0 965 662 A1 | 12/1999 |
| EP | 1 035 235 A1 | 9/2000 |

(List continued on next page.)

OTHER PUBLICATIONS

Sadamitsu et al., "Dependence of the Grown–in Defect Distribution on Growth Rates in Czochralski Silicon", Japanese Journal of Applied Physics, vol. 32, pp. 3675–3681 Part 1, No. 9A, Sep. 1993.

Nakamura et al., "The Effect of Nitrogen on the Grown–in Defect Formation in CZ Silicon Crystals", Proceedings of the kazusa akademia park forum on the science and technology of silicon materials, Nov. 24–26, 1999.

(List continued on next page.)

*Primary Examiner*—Felisa Hiteshew
(74) *Attorney, Agent, or Firm*—Oliff & Berridge, PLC

(57) ABSTRACT

A method for producing a silicon single crystal in accordance with CZ method, characterized in that before producing the crystal having a predetermined kind and concentration of impurity, another silicon single crystal having the same kind and concentration of impurity as the crystal to be produced is grown to thereby determine an agglomeration temperature zone of grown-in defects thereof, and then based on the temperature, growth condition of the crystal to be produced or temperature distribution within a furnace of a pulling apparatus is set such that a cooling rate of the crystal for passing through the agglomeration temperature zone is a desired rate to thereby produce the silicon single crystal. A silicon single crystal produced in accordance with the above method, characterized in that a density of LSTD before subjecting to heat treatment is 500 number/cm$^2$ or more and the average defect size is 70 nm or less. The present invention provides by CZ method a silicon single crystal and a silicon wafer wherein the dispersion in size and density of grown-in defects is suppressed effectively and the quality is stabilized regardless of the variety of crystals, and a producing method therefor.

15 Claims, 2 Drawing Sheets

FOREIGN PATENT DOCUMENTS

| | | |
|---|---|---|
| JP | 60-251190 | 12/1985 |
| JP | 4-192345 | 7/1992 |
| JP | 9-309789 | 12/1997 |
| JP | 10-194890 | 7/1998 |
| JP | 10-208987 | 8/1998 |
| JP | 10-330189 | 12/1998 |
| JP | 11-349393 | 12/1999 |

OTHER PUBLICATIONS

Dupret et al., "Global modelling of heat transfer in crystal growth furnaces", Int. Journal of Heat Mass Transfer, vol. 33, No. 9, pp. 1849–1871, 1990.

Takano et al., "Relationship between grown–in defects and thermal history during CZ Si crystal growth", Journal of Crystal Growth, vol. 180, 1997, pp. 363–371.

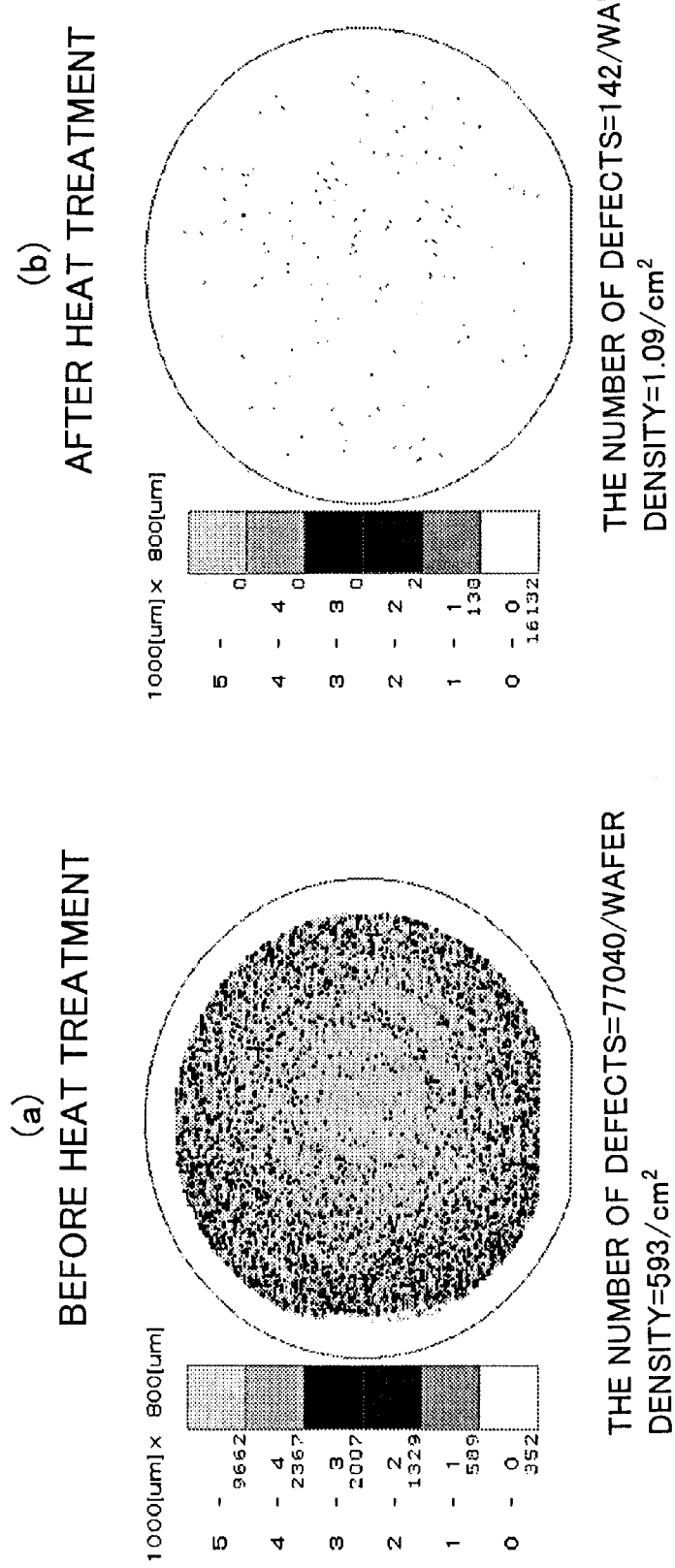

METHOD FOR MANUFACTURING SILICON SINGLE CRYSTAL, SILICON SINGLE CRYSTAL MANUFACTURED BY THE METHOD, AND SILICON WAFER

The Application is a 371 of PCT/JP00/05873 Aug. 30, 2000.

TECHNICAL FIELD

The present invention relates to a method for producing a silicon single crystal wherein size and density of grown-in defect incorporated in the crystal when growing the silicon single crystal by a Czochralski method (hereinafter may be abbreviated to CZ method) are controlled to be a desired value. The present invention also relates to silicon single crystals and silicon wafers produced by the method.

BACKGROUND ART

Along with a recent tendency to increase the degree of integration of semiconductor circuits, circuit elements have been becoming finer; thus quality requirements are becoming severer on silicon single crystals produced by CZ method which are used as a substrate. Particularly, there has been required a reduction of defects generated during single crystal growth, such as FPD (Flow Pattern Defect), LSTD (Laser Scattering Tomography Defect), and COP (Crystal Originated Particle), which are called grown-in defect and may cause a degradation in oxide dielectric breakdown voltage characteristics or device characteristics.

Recently, when a silicon single crystal is grown, there has been used a producing method wherein defects incorporated in the crystal during growth of the crystal are suppressed by changing growth conditions or by adjusting temperature distribution within a furnace of a pulling apparatus.

For example, an agglomeration temperature zone of grown-in defects of a silicon single crystal grown by a CZ method is usually in the range of 1150 to 1080° C., and size and density of the grown-in defects can be controlled to be desired values by increasing or decreasing a cooling rate of the crystal for passing through the temperature range. When the cooling rate of silicon single crystal in the agglomeration temperature zone of grown-in defects is decreased, an agglomeration of grown-in defects such as COP is promoted, with the result that a silicon single crystal having low crystal defect density can be obtained. Accordingly if thus-obtained silicon single crystal is processed to provide wafers and the wafer is used as a substrate material for integrated circuit device, a density of defects in the wafer surface is remarkably low so that devices having an excellent oxide dielectric breakdown voltage characteristics can be fabricated.

Meanwhile, in the above producing method, although it is possible to keep low density of grown-in defects, there is a drawback that the defect size is in inverse proportion to the defect density and thus the defect size becomes larger as the defect density is reduced (See Japanese Patent Application Laid-open (kokai) No. 10-208987). Along with miniaturization and high integration of integrated circuits, it is said to be undesirable that defects having large size exist in a wafer used as a substrate for integrated circuits, even if the defect density is low.

When the cooling rate of a crystal for passing through the agglomeration temperature zone of grown-in defects is increased by adjusting pulling conditions of the crystal or temperature distribution within a furnace, growth of grown-in defects is suppressed and the defect size itself can be suppressed to be extremely small. However, as the size of defects becomes smaller, the density of defects tends to be higher inversely. In case a number of defects exist on a wafer, a problem in terms of the oxide dielectric breakdown voltage characteristics is caused when the wafer is processed to integrated circuits. Thus, so far the producing method wherein the cooling rate in the agglomeration temperature zone is increased has not been employed so much.

However, recently it was confirmed that even in a silicon wafer in which grown-in defects are generated in the high density, if a size of the defects is very small, the defects can be eliminated by subjecting the wafer to heat treatment. The attention has been riveted to a method in which the defects in the surface of a wafer are suppressed effectively by combining a method for controlling the cooling rate of the crystal in the agglomeration temperature zone of grown-in defects when pulling the silicon single crystal with a heat treatment of the wafer obtained by processing the crystal.

Meanwhile, when nitrogen is added in a silicon single crystal, an agglomeration of defects generated in the crystal during growth of the single crystal is further suppressed. There was recently developed a method in which a size of grown-in defects is kept to be extremely small by controlling properly a time for passing the agglomeration temperature zone in addition to the above method by addition of nitrogen, and then by subjecting wafers processed from the single crystal to heat treatment, the defects in the wafer surface are eliminated (see Japanese Patent Application No. 10-170629). By adopting this method, the silicon single crystal can pass through the agglomeration temperature zone at high speed during the growth, and thereby the defects in the wafer surface can be eliminated without lowering a production efficiency of the crystal. As a result, the oxide dielectric breakdown voltage characteristics are good and the defects having large size do not exist on the wafer, so that the wafer can be used as a substrate material of high quality for integrated circuit. Thus, currently the technique with respect to that method has progressed with great speed.

However, recent test results show some cases where size or density of grown-in defects cannot be regulated evenly and the defect size is dispersed, for example, even though defects can be suppressed by adding nitrogen as impurity and adjusting properly the time for passing of the crystal in a temperature range of 1150–1080° C., i.e., an agglomeration temperature zone of grown-in defects, and even though the passing time of the crystal in the above temperature range, i.e. a cooling rate of the crystal in the range of 1150–1080° C. is controlled similarly by significantly changing the concentration of added impurity, i.e., nitrogen or by finely adjusting a temperature distribution within a furnace by changing Hot Zone of the pulling apparatus. Besides, even though the wafer obtained by processing is subjected to the heat treatment for eliminating the defects, there are some cases where the defects remain without being eliminated, which causes a problem in production of a wafer having a few defects.

DISCLOSURE OF THE INVENTION

The present invention has been accomplished to solve the above-mentioned problem, and the prime object of the present invention is to provide a silicon single crystal produced by CZ method wherein the dispersion in size and density of grown-in defects is suppressed effectively and the quality is stabilized regardless of the variety of crystals, a silicon wafer and a producing method therefor.

To achieve the above object, the present invention provides a method for producing a silicon single crystal in accordance with a Czochralski method, wherein before producing a crystal having a predetermined kind and concentration of impurity, another silicon single crystal having the same kind and concentration of impurity as the crystal to be produced is grown to thereby determine an agglomeration temperature zone of grown-in defects thereof, and then based on the temperature, growth condition of the crystal to be produced or temperature distribution within a furnace of a pulling apparatus is set such that a cooling rate of the crystal for passing through the agglomeration temperature zone is a desired rate to thereby produce the silicon single crystal.

It has been conventionally said that an agglomeration temperature zone when a silicon single crystal is grown by CZ method is generally in the range of 1150 to 1080° C. However, the above range corresponds to a case where any impurity such as nitrogen is not doped in the crystal. It is revealed that in case that impurity of high concentration is added in a growing crystal, the agglomeration temperature zone of grown-in defects varies slightly under the influence of impurities such as nitrogen added for suppression of defects, oxygen supplied from a quartz crucible, boron for providing a characteristic of semiconductor, and the like. In a silicon single crystal manufactured as a product, these impurities of predetermined amount are usually added in accordance with the variety of crystals, and the agglomeration temperature zone also shifts slightly from the range of 1150–1080° C. depending on a kind and concentration of the impurities. Furthermore, in the process of investigation and tests regarding the influence of impurities, the inventors of the present invention precisely measured an agglomeration temperature zone wherein any impurity is not added, and found that the agglomeration temperature zone was in the range of 1100–1010° C. Hereinafter this temperature range is used unless otherwise indicated.

Accordingly, in order to suppress crystal defects by adding an impurity and besides by utilizing an agglomeration temperature zone of grown-in defects, it needs to grow a single crystal after precise determination of the agglomeration temperature zone which varies depending on a kind or concentration of the impurity in the crystal. Thus in order to grow a silicon single crystal which is processed into product wafers having a stable defect size and density, it is effective to take the following steps; prior to producing the products, performing in advance a growth test of the silicon single crystal including the same impurity as the crystal to be produced, investigating the agglomeration temperature zone of grown-in defects thereof, setting proper condition for growing the single crystal or temperature distribution within a furnace of pulling apparatus, and then producing the silicon single crystal. According to these steps, it is possible to properly keep the cooling rate in the intended agglomeration temperature zone, so that the size and density of grown-in defects can be controlled to be desired values with precision.

In this case, the kind and concentration of the impurity may be at least nitrogen and concentration thereof.

The agglomeration temperature zone varies slightly depending on the kind of impurity and the concentration thereof, and results of test show that, when nitrogen is doped, influence of the impurity is very significant. Therefore, in order to control at least the size and density of grown-in defects in the crystal doped with nitrogen it is desirable to perform a test for determining a change of the agglomeration temperature zone.

According to the present invention, there is provided a method for producing a silicon single crystal in which nitrogen is added as impurity, wherein an agglomeration temperature zone of grown-in defects of the crystal in which nitrogen concentration is in the range of $0.1 \times 10^{13}$ to $8.0 \times 10^{13}/cm^3$ is assumed to shift by $-50°$ C. in the high temperature limit and by $-20°$ C. in the low temperature limit respectively from an agglomeration temperature zone in a case that nitrogen is not added, and then growth condition of the crystal to be produced or temperature distribution within a furnace of a pulling apparatus is set such that a cooling rate of the crystal for passing through the agglomeration temperature zone is a desired rate to thereby produce the silicon single crystal.

As mentioned above, when nitrogen is added as impurity, as long as the concentration of nitrogen in the silicon single crystal is in the range of $0.1 \times 10^{13}$ to $8.0 \times 10^{13}/cm^3$, if the agglomeration temperature zone of grown-in defects at this time is assumed to be a range wherein the high temperature limit and the low temperature limit are shifted respectively by $-50°$ C. and by $-20°$ C. from an agglomeration temperature zone of a silicon single crystal without being doped with nitrogen (1100–1010° C.), namely, a range of 1050–990° C. and then the silicon single crystal is grown, the similar defects suppressing effect can be obtained.

That is, as long as the nitrogen concentration is in the above range, if the high temperature limit and the low temperature limit are assumed to shift respectively by $-50°$ C. and by $-20°$ C. from the agglomeration temperature zone without nitrogen doping, and then producing condition of the silicon single crystal and temperature distribution within a furnace of a pulling apparatus are set, the error is within allowable range for suppressing grown-in defects and does not significantly affect the size and density distribution of the defects. If such an approximate range is adopted, it is not necessary to perform growth tests for determining an agglomeration temperature zone according to a concentration of impurity in the silicon single crystal before producing products. Thus it becomes possible to produce silicon single crystals effectively, resulting in increase in terms of productivity and yield, and improvement in terms of quality and cost.

In the aforementioned producing method, the average cooling rate of the crystal for passing through the agglomeration temperature zone of grown-in defects is preferably 1.6° C./min or more.

As described above, when the impurity is added in a silicon single crystal, if pulling condition or temperature distribution within a furnace of a pulling apparatus is set such that the cooling rate of the crystal in the agglomeration temperature zone is controlled to be rapid, i.e., 1.6° C./min or more on the average, the crystal of which the defect size is not dispersed widely can be grown. For example, in case that nitrogen is doped as impurity and its concentration is in the range of $0.1 \times 10^{13}$ to $8.0 \times 10^{13}/cm^3$, the crystal of which the defect size is not dispersed widely and is uniform as 60 nm or less on the average can be grown. If the size of crystal defects is small and is not dispersed widely as mentioned above, even though the defect density of a wafer obtained by processing is high, the defects can be eliminated by subjecting the wafer to heat treatment, so that wafers having high quality can be produced. Besides, even though the defects are not eliminated and still remain in the surface layer of the wafer, the defect size is extremely small, and therefore the defects hardly gives a harmful influence on characteristics of integrated circuit fabricated on the wafer.

Further, the average cooling rate of the crystal for passing through the agglomeration temperature zone of grown-in defects is preferably 1.0° C./min or less.

As described above, when the impurity is added in a silicon single crystal, if pulling condition or temperature distribution within a furnace of pulling apparatus is set such that the cooling rate of the crystal in the agglomeration temperature zone is controlled to be slow, i.e., 1.0° C./min or less on the average, and then the silicon single crystal is grown, even in case where an impurity etc. is doped therein, it is possible to obtain wafers by processing the silicon single crystal, of which the defect density is extremely low.

According to the present invention, there is provided a silicon single crystal grown in accordance with the above-mentioned method, wherein a density of LSTD before subjecting to heat treatment is 500 number/cm$^2$ or more.

In a crystal having a very high defect density in which a density of LSTD is 500 number/cm$^2$ or more, a size of defect itself is very small as 70 nm or less on the average (number average), even though the density of defects in the crystal is high. Therefore, by subjecting wafers obtained by processing the silicon single crystal to a certain heat treatment, the defects can be eliminated easily. Especially, by keeping the cooling rate of the silicon single crystal in the agglomeration temperature zone to be proper during the growth, as performed in the present invention, as long as the kind and concentration of impurity are almost same, it is possible to make the defect size almost even with a small dispersion. As a result, when the heat treatment for eliminating defects is conducted, further effect of eliminating the defects can be obtained.

According to the present invention, there is provided a silicon wafer produced from the above-mentioned silicon single crystal, wherein the wafer was subjected to heat treatment in an atmosphere of non-oxidizing gas.

This heat treatment for eliminating crystal defects is desirably conducted in non-oxidizing atmosphere such as hydrogen, argon, or mixed gas of both. Condition of heat treatment at this time are not particularly limited as long as the defects are eliminated under that condition. However, the heat treatment approximately at 1200° C. for an hour or at 1150° C. for two hours is effective. Further, as to selecting the conditions for heat treatment, the time for passing in a desired agglomeration temperature zone is determined to thereby grow a crystal, and then the conditions of heat treatment corresponding to a size of defects generated in the crystal may be selected.

As explained above, if an agglomeration temperature zone of crystal defects which changes depending on a kind and concentration of added impurity is determined in advance, and then based on the temperature, growth conditions of a silicon single crystal or temperature distribution within a furnace of a pulling apparatus is set such that a cooling rate of the crystal for passing through the agglomeration temperature zone is a desired rate and the silicon single crystal is grown, a size and density of the crystal defects, called grown-in defect, which exist in the surface layer of the silicon wafer can be controlled to be desired values without dispersion, and additionally the increase in terms of productivity and yield and the improvement in terms of quality and cost can be achieved.

BRIEF EXPLANATION OF THE DRAWINGS

FIG. 2 is an explanatory view of an effect of heat treatment for a silicon wafer obtained in accordance with the producing method of the present invention: (a) distribution of LSTD before heat treatment, and (b) distribution of LSTD after heat treatment.

BEST MODE FOR CARRYING OUT THE INVENTION

Figure 1:
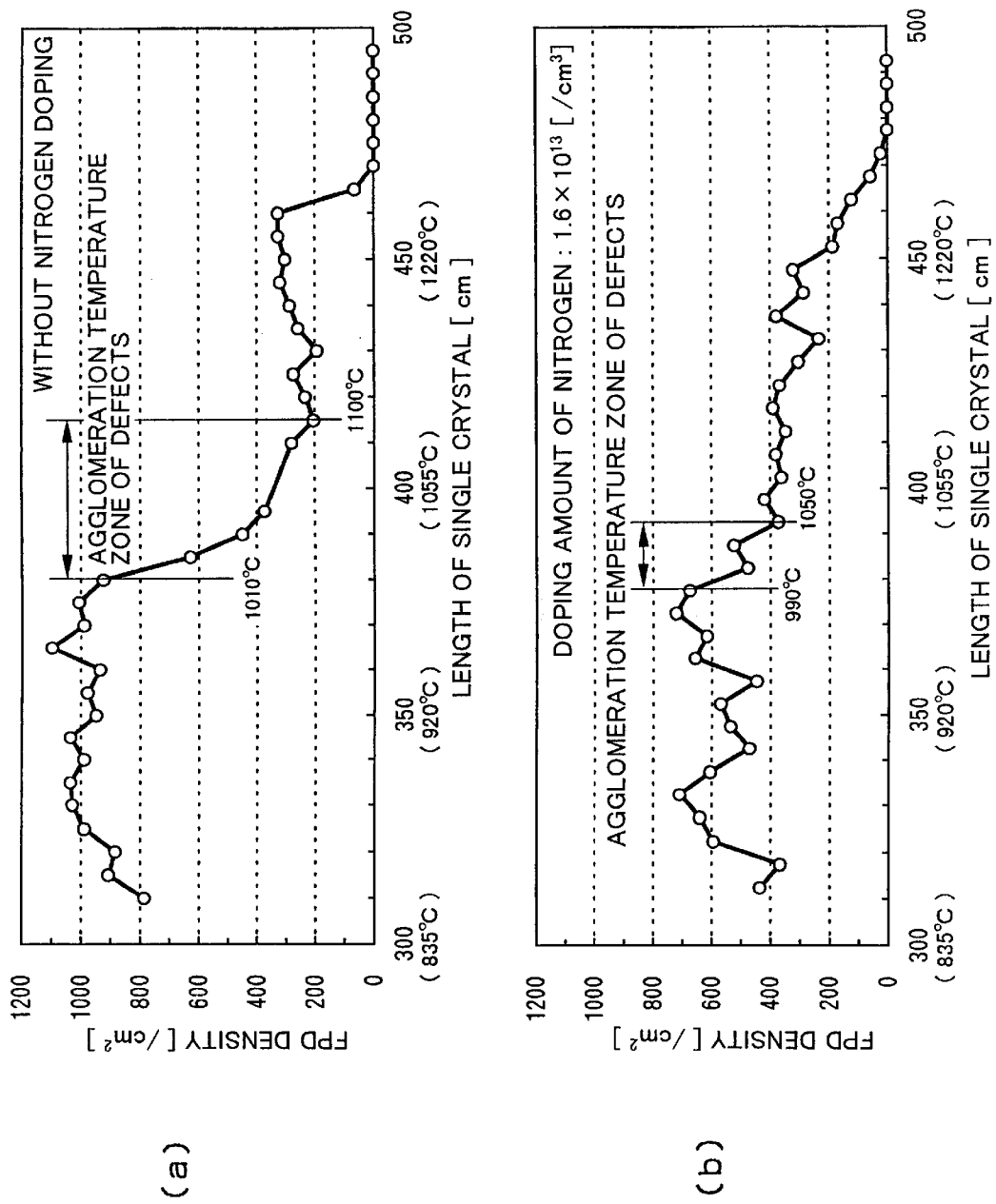
FIG. 1 is an explanatory view of a size and position of agglomeration temperature zone of crystal defects in a silicon single crystal: (a) a case where nitrogen is not doped, and (b) a case where nitrogen is doped.

Hereafter, the present invention will be explained in detail, but the present invention is not limited thereto. First, terms appearing herein, especially main terms with regard to grown-in defect will be described.

(1) FPD (Flow Pattern Defect) denotes flow patterns which, together with pits, are generated in the surface of a wafer which is sliced from a grown silicon single-crystal ingot and which is treated by the steps of: removing a damaged layer from the surface portion of the wafer through etching with a mixed solution of hydrofluoric acid and nitric acid; and etching the wafer surface with a mixed solution of $K_2Cr_2O_7$, hydrofluoric acid, and water (Secco etching). As FPD density in the wafer surface portion becomes higher, failure rate with regard to dielectric breakdown strength of oxide film increases (Japanese Patent Laid-Open (kokai) No. 4-192345).

(2) LSTD (Laser Scattering Tomography Defect) denotes a defect existing in a wafer, and the scattering light due to the defect can be detected in the following manner. In that, a wafer is sliced from a grown silicon single-crystal ingot, and is then treated by the steps of: removing a damaged layer from the surface portion of the wafer through etching with a mixed solution of hydrofluoric acid and nitric acid; and cleaving the wafer. When infrared light is introduced into the wafer through the cleavage plane, and light exiting from the wafer surface is detected, a scattering light due to the defects existing in the wafer can be detected. A scattering defect detected in this observation has already been reported at a meeting of an academic society or the like and is considered to be an oxide precipitate (J.J.A.P. vol. 32, p.3679, 1993). According to recent research, LSTD is reported to be an octahedral void.

Further, in order to observe defects in the surface layer of a wafer, another method has been developed recently. In this method, the infrared light laser is introduced obliquely into a wafer on which mirror-polishing or epitaxial growth was performed, and a scattering light due to the defects is measured along the direction vertical to the wafer through use of TV camera and analyzed. By adopting that method, it has become possible to evaluate defects which are present in the extreme surface layer of a few micron with non-destructive inspection. Further, in this case, the defect density is often represented as [number/cm$^2$], i.e., the number of defects per unit area.

(3) COP (Crystal Originated Particle) denotes a defect which deteriorates the dielectric breakdown strength of oxide film at a central portion of a wafer and which is revealed as FPD in the case of treatment through Secco etching, but is revealed as COP in the case of cleaning in SC-1 (cleaning by using mixed aqueous solution of ammonia, hydrogen peroxide, example of ratio is $NH_4OH:H_2O_2:H_2O=1:1:10$) which serves as a selective etchant. The pit has a diameter not greater than 1 μm and is examined by a light scattering method.

The inventors of the present invention had considered that when a silicon single crystal is grown by CZ method, an agglomeration temperature zone of grown-in defects generated in the crystal is not affected by quality of the crystal, i.e., impurity and the like included in the single crystal, and is constant. That is, it had been considered that during growth of the single crystal by CZ method, a defect size is not related to the impurity in the crystal and is adjusted almost evenly according to cooling rate of the crystal in the range of 1100–1010° C. However, the inventors studied and examined a defect suppressing effect by changing concentration of impurity, especially nitrogen, contained in the crystal, and a defect suppressing effect by changing cooling rate in the agglomeration temperature zone. As a result, it was revealed that according to doping amount of impurity in the crystal, even if the cooling rate in the agglomeration temperature zone of 1100–1010° C. is set to be same, due to differences in other pulling condition, hot zone, or the like, the suppression effect as was expected cannot be obtained in terms of the size of grown-in defects formed in the single crystal and the size is dispersed. Subsequently the inventors conducted studies and examinations to find the cause. As a result it was revealed that the agglomeration temperature zone of 1100–1010° C. shifted according to the kind and doping amount of the impurity added in the crystal. The inventors found that if the proper cooling rate of the crystal, other pulling condition, hot zone, or the like, which corresponds to the shifted agglomeration temperature zone, is determined to thereby grow the silicon single crystal, the dispersion in size and density of grown-in defect can be suppressed. Thus they have accomplished the present invention by finding out various conditions.

In general, the agglomeration temperature zone of grown-in defects had been conventionally considered to be 1150–1080° C. and to be fixed. However, the inventors of the present invention have found that the agglomeration temperature zone of defects varied slightly depending on impurities (oxygen, nitrogen, boron, phosphorus, etc.) included in the crystal, especially the nitrogen doping amount.

Further, on the process of investigation and examination of influence of impurities, the inventors of the present invention precisely measured the agglomeration temperature zone of the crystal in which any impurity is not added. As shown in the following test result, it was revealed that the temperature range of 1100–1010° C. was accurate value as the agglomeration temperature zone.

Accordingly, if prior to producing a silicon single crystal having a predetermined kind and concentration of impurity, a silicon single crystal having the same kind and concentration of impurity as the crystal to be produced is grown to thereby determine an agglomeration temperature zone of grown-in defects thereof, then based on the temperature, growth condition of the crystal to be produced or temperature distribution within a furnace of a pulling apparatus is set such that a cooling rate of the crystal for passing through the agglomeration temperature zone becomes a desired rate, and the silicon single crystal is grown, it becomes possible to precisely obtain desired defect size and density, so that products with a small dispersion can be produced.

Next, the investigation and examination of agglomeration temperature zone in the present invention will be described.

As a process for determining an agglomeration temperature zone, there are mentioned "experiment of changing pulling rate suddenly", "test of separating crystal from melt in the course of growth and cooling it rapidly", or the like, in which the same amount of impurity as products is doped in a single crystal, and then the pulling rate is changed suddenly.

(Test 1) [Determination of Normal Agglomeration Temperature Zone (Without Adding Nitrogen)]

Through use of a general single crystal pulling apparatus for CZ method, 50 kg of polycrystalline material of silicon was charged into a quartz crucible having a diameter of 18 inches, a silicon single crystal ingot of p-type having a diameter of 6 inches, orientation <100>, a resistiviy of 10 Ωcm, and oxygen concentration of 15 ppma (JEIDA: Japan Electronic Industry Development Association standard) was pulled without nitrogen doping, while the pulling rate was controlled to be 1.0/min until length of the crystal body became 50 cm, and thereafter the crystal pulling was continued at a rate of 0.4/min until the length of the crystal body became 80 cm. When the length of the crystal body became 80 cm, a tail portion was formed, and finally a crystal ingot of 42 kg was obtained.

Wafers were sliced from thus-obtained single crystal ingot with a wire saw, and subjected to chamfering, lapping, etching, and mirror polishing. The silicon wafers having a diameter of 6 inches were produced. The wafers were subjected to Secco etching, and pit density was measured by observing the surface thereof with a microscope to determine a density of grown-in defects as FPD.

FPD density distribution along the crystal growth axis direction is shown in FIG. 1($a$). FIG. 1($a$) shows that the FPD density changes widely at a position of about 38–41.5 cm from a shoulder portion of the crystal which is defined to be 0 cm. Based on this result, a temperature distribution along the crystal axis direction right after changing the crystal pulling rate was calculated using a heat analysis simulation such as global heat transfer analysis software FEMAG (F. Dupret, P. Nicodeme, Y. Ryckmans, P. Wouters, and M. J. Crochet, Int. J. Heat Mass Transfer, 33, 1849 (1990)). As a result, it was revealed that the agglomeration temperature zone without nitrogen doping is 1100–1010° C. (Conventionally there had been an accepted theory that the agglomeration temperature zone is 1150–1080° C.). The value of FPD density in FIG. 1 is average of 3 points, a peripheral portion of the wafer (a point at a distance of 10 mm from the periphery along the radial direction), a point at a distance of R/2 from the center (R: radius of wafer), and the center of the wafer.

(Test 2) [Measurement of Agglomeration Temperature Zone with Adding Nitrogen]

A single crystal ingot was pulled under the same conditions as Test 1, except that doping amount of nitrogen is $1.6 \times 10^{13}/cm^3$.

Silicon mirror polished wafers were produced from thus-obtained single crystal ingot in accordance with the same manner as in Test 1. FPD density distribution as shown in FIG. 1($b$) was obtained. As a result, it was confirmed that an agglomeration temperature zone with adding nitrogen was 1050–990° C., and by adding impurity, especially nitrogen, the agglomeration temperature zone changed significantly. As compared to the case where nitrogen is not added (Test 1: 1100–1010° C.), the result was that the high temperature limit and the low temperature limit were shifted by −50° C. and by −20° C., respectively.

An agglomeration temperature zone in which the doping amount of nitrogen was varied over the range between $0.1 \times 10^{13}/cm^3$ and $8.0 \times 10^{13}/cm^3$ was also determined. The result was that the agglomeration temperature zone was approximately in the range 1050–990° C.

As mentioned above, as a result of remarking nitrogen as impurity, it was revealed that the agglomeration temperature zone without nitrogen doping is 1100–1010° C., while the agglomeration temperature zone of the crystal doped with nitrogen in the range of $0.1 \times 10^{13}$ to $8.0 \times 10^{13}/cm^3$ is shifted to the lower temperature zone of 1050–990° C.

Accordingly, in a method for producing a silicon single crystal in which nitrogen is added as impurity, if an agglomeration temperature zone of grown-in defects of the crystal in which nitrogen concentration is in the range of $0.1 \times 10^{13}$ to $8.0 \times 10^{13}/cm^3$ is assumed to shift respectively by $-50°$ C. in the high temperature limit and by $-20°$ C. in the low temperature limit from an agglomeration temperature zone in the case that nitrogen is not added, then growth condition of the crystal to be produced or temperature distribution within a furnace of a pulling apparatus is set such that a cooling rate of the crystal for passing through the agglomeration temperature zone becomes a desired rate, and the silicon single crystal is grown, it becomes possible to grow a single crystal with a small dispersion in size and density of defects, and besides it becomes possible to increase productivity and yield, and to improve quality and cost.

Further, in case where a density of nitrogen is more than $8.0 \times 10^{13}/cm^3$, an agglomeration temperature zone of grown-in defect is expected to shift to further lower temperature zone. However, also in this case, according to the present invention, a silicon single crystal having desired nitrogen concentration may be grown in advance to thereby determine the agglomeration temperature zone of grown-in defects, then based on the temperature, growth condition of the silicon single crystal or temperature distribution within a furnace of a pulling apparatus may be set such that a cooling rate of the crystal for passing through the agglomeration temperature zone becomes a desired rate, and then the silicon single crystal may be produced.

Furthermore, when the impurity is added in a silicon single crystal, if pulling condition or temperature distribution within a furnace of a pulling apparatus is set such that the cooling rate of the crystal in the agglomeration temperature zone is controlled to be rapid, i.e., $1.6°$ C./min or more on the average, the crystal of which the defect size is not dispersed widely can be grown. For example, in case where nitrogen is doped as impurity and its concentration is in the range of $0.1 \times 10^{13}$ to $8.0 \times 10^{13}/cm^3$, the crystal of which the defect size is not dispersed widely and is uniform as 60 nm or less on the average can be grown. If the size of crystal defects is small and is not dispersed widely as mentioned above, even though the defect density of the wafer obtained by processing is high, the defects can be eliminated by subjecting the wafer to heat treatment, so that wafers having high quality can be produced. Besides, even though the defects are not eliminated and still remain in the surface layer of the wafer, the defect size is extremely small, and therefore the defects hardly give a harmful influence on characteristics of integrated circuit fabricated on the wafer.

Moreover, when the impurity is added in a silicon single crystal, if pulling condition or temperature distribution within a furnace of a pulling apparatus is set such that the cooling rate of the crystal in the agglomeration temperature zone is controlled to be slow, i.e., $1.0°$ C./min or less on the average and then the silicon single crystal is grown, even in case where an impurity etc. is doped therein, it is possible to obtain wafers processed from the silicon single crystal, of which the defect size is large, but the defect density is extremely low and the oxide dielectric breakdown voltage characteristics is good.

According to the present invention, there is provided a silicon single crystal produced in accordance with the above-mentioned producing method, wherein a density of LSTD before subjecting to heat treatment is 500 number/$cm^2$ or more.

In a crystal wherein a defect density is very high, e.g., a density of LSTD is 500 number/$cm^2$ or more, a size of defect itself is very small as 75 nm or less, even though the density of defects in the crystal is high. Therefore, by subjecting wafers processed from the silicon single crystal to a certain heat treatment, the defects can be eliminated. Especially, by keeping the cooling rate of the silicon single crystal in the agglomeration temperature zone to be a proper rate during the growth as performed in the present invention, as long as the kind and concentration of impurity is almost same, it is possible to make the defect size almost even with a small dispersion. As a result, when the heat treatment for eliminating defects is conducted, further effect of eliminating the defects can be obtained.

According to the present invention, there is provided a silicon wafer produced from the above-mentioned silicon single crystal, wherein the wafer was subjected to heat treatment in an atmosphere of non-oxidizing gas.

This heat treatment for eliminating crystal defects is desirably conducted in non-oxidizing atmosphere such as hydrogen, argon, or mixed gas of both. Conditions of heat treatment at this time are not particularly limited as long as the defects are eliminated under the condition. However, the heat treatment approximately at $1200°$ C. for an hour or at $1150°$ C. for two hours is effective. Further, in order to select the conditions of heat treatment, the time of passing in a desired agglomeration temperature zone is determined to thereby grow a crystal, and then the conditions of heat treatment corresponding to a size of defects generated in the crystal may be selected.

In the present invention, a silicon single crystal doped with impurity, for example, nitrogen, can be grown by CZ method according to the known method as disclosed in, for example, Japanese Patent Application Laid-open (kokai) No 60-251190.

Namely, in CZ method comprising contacting a seed crystal with a melt of polycrystalline silicon raw material contained in a quartz crucible and pulling it with rotating to grow a silicon single crystal ingot having an intended diameter, nitrogen can be doped in a silicon single crystal by placing nitride previously in the quartz crucible, feeding nitride into the silicon melt, or using an atmosphere gas containing nitrogen. A doping amount in the crystal can be controlled by controlling an amount of nitride, or concentration or time of introduction of nitrogen gas. Thus, nitrogen concentration can be easily controlled in the above-mentioned range of $0.1 \times 10^{13}$ to $8.0 \times 10^{13}/cm^3$.

As described above, generation of crystal defects introduced during growth of crystal can be suppressed by doping nitrogen while a single crystal is grown by CZ method. Furthermore, it is important to set a cooling rate of the crystal in a temperature range of $1050–990°$ C., i.e., an agglomeration temperature zone with nitrogen doping, to high rate as $1.6°$ C./min or more, or low rate as $1.0°$ C./min or less. In order to actually fulfill such a condition for producing a crystal, there can be provided an apparatus for cooling the crystal in a desired rate of cooling from $1050°$ C. to $990°$ C. in a chamber of an apparatus for producing a silicon single crystal by CZ method. Such an apparatus may be an apparatus which can cool a crystal by spraying a cooling gas thereto, or which is provided with a water cooled ring so as to surround a crystal at a predetermined position above the melt. Alternatively, there is another technique for designing a structure of so-called hot zone, such that a heat insulating material or heat shield board is provided to surround a crystal so as to establish a temperature gradient by changing its position. In this case, the cooling rate can be controlled in a desired range by controlling the pulling rate of the crystal.

The present invention will next be explained specifically by way of examples and comparative example. However, the present invention is not limited thereto.

EXAMPLE 1

When nitrogen is doped as impurity, a silicon single crystal was grown with a view to producing silicon wafers of which the defect size is uniform as about 60 nm and not dispersed widely.

Firstly, as a pre-test, a silicon single crystal having the same kind and concentration of impurity as a silicon single crystal to be produced was grown to thereby determine an agglomeration temperature zone of grown-in defects thereof. A single crystal ingot was pulled under the same conditions and methods as that used in the aforementioned Test 1, except that doping amount of nitrogen is $1.6\times10^{13}/\text{cm}^3$.

Mirror polished silicon wafers were produced from the obtained single crystal ingot in accordance with the same manner as in Test 1. FPD density distribution as shown in FIG. 1(b) was obtained in the crystal axis direction. As a result, it was confirmed that an agglomeration temperature zone with adding nitrogen was 1050–990° C., and by adding impurity, especially nitrogen, the agglomeration temperature zone changed significantly. As compared to the case where no nitrogen is added (Test 1: 1100–1010° C.), the result was that the high temperature limit and the low temperature limit were shifted by −50° C. and by −20° C., respectively.

Next, based on the above agglomeration temperature zone, growth condition of the silicon single crystal or temperature distribution within a furnace of a pulling apparatus was set such that a cooling rate of the crystal for passing through the agglomeration temperature zone is a desired rate, and then the silicon single crystal was grown.

Through use of a single crystal pulling apparatus by CZ method whose furnace has a hot zone structure adapted to rapid cooling (referred to as "A type"), 50 kg of polycrystalline material of silicon was charged into a quartz crucible having a diameter of 18 inches, a silicon single crystal ingot of p-type having a diameter of 6 inches, orientation <100>, a resistiviy of 10 Ωcm, and oxygen concentration of 15 ppma (JEIDA: Japan Electronic Industry Development Association standard) was grown with doping nitrogen of $1.6\times10^{13}/\text{cm}^3$, at the pulling rate of 1.0/min.

The growing of the single crystal ingot was performed under conditions such that a cooling rate in the agglomeration temperature zone of 1050–990° C. was 1.6° C./min.

Wafers were sliced from thus-obtained single crystal ingot with a wire saw, and subjected to chamfering, lapping, etching, and mirror polishing. The silicon wafers having a diameter of 6 inches were produced.

The silicon single crystal wafer was measured by observing the surface thereof with a transmission electron microscope (TEM) to determine a size of defects which are present in the surface of the wafer. As a result, the defect size was about 60 nm on the average, which reveals that the defect size is reduced by adjusting properly the nitrogen doping effect and the cooling rate of crystal in the agglomeration temperature zone.

Furthermore, the wafer was subjected to heat treatment for eliminating defects (at 1200° C. for an hour, in an atmosphere of argon gas), and the surface of the wafer was observed. As a result, most of defects could be eliminated. The test conditions and results are shown together in Table 1.

As apparent from the results, if a cooling rate of the crystal in the agglomeration temperature zone of 1050–990° C. is controlled, in which the high temperature limit and the low temperature limit of the agglomeration temperature zone with nitrogen doping are shifted by −50° C. and by −20° C. respectively, the size and density of defects can be controlled to be desired values.

TABLE 1

| | Example No. | | |
|---|---|---|---|
| Item | Example 1 | Example 2 | Comparative Example |
| Type of hot zone in pulling apparatus | A type | B type | C type |
| Concentration of Impurity (nitrogen, /cm³) | $1.6 \times 10^{13}$ | $1.6 \times 10^{13}$ | $1.6 \times 10^{13}$ |
| Cooling rate of crystal (° C./min) | | | |
| ① 1100–1010° C. | 1.9 | 1.9 | 1.9 |
| ② 1050–990° C. | 1.6 | 2.0 | 1.3 |
| Defect size (average, nm) | 60 | 52 | 80 |
| Surface Condition of Wafer after heat Treatment (in atmosphere of Ar, 1200° C. × 1 hr) | Most of defects were eliminated. | Defects which can be observed were almost perfectly eliminated. | Many of defects were not eliminated and remained. |

[Notice]
① Agglomeration temperature zone of defect without adding impurity
② Agglomeration temperature zone of defect with adding nitrogen as impurity

EXAMPLE 2

A single crystal ingot was grown under the same conditions as Example 1, except that a temperature distribution within a furnace of a pulling apparatus was changed by changing hot zone therein, and thereby a cooling rate of the crystal for passing through the assumed agglomeration temperature zone, i.e., 1050–990° C. was further rapid as 2.0° C./min (B type).

As a result, by increasing the cooling rate of the crystal in the agglomeration temperature zone with adding nitrogen, a size of crystal defects can be controlled to be smaller. Further, since the size of crystal defects could be decreased to 52 nm on the average, it becomes possible to almost perfectly eliminate the defects by subjecting the wafer to heat treatment. The test conditions and results are shown together in Table 1.

So far, only defect size has been described as the subject matter. The size of grown-in defects tends to be in inverse proportion to the defect density. On this basis, grown-in defects in the wafer obtained in Example 2, which are observed as LSTD with a LSTD-Sonner (MO-601, produced by Mitsui Mining And Smelting Company, Limited), were observed under the condition that the defect size is 50 nm or more and the measurement range is from the surface to 5 μm in depth. The results as shown in FIG. 2 were obtained.

This defect density distribution map shows that if LSTD density before eliminating defects is 500 number/cm² or more, most of defects can be eliminated by heat treatment.

Comparative Example

A single crystal ingot was grown under the same conditions as Example 1, except that a pretest for determining the agglomeration temperature zone with adding nitrogen was not performed and a general hot zone (C type) was used. At this time, a cooling rate of the crystal in the conventional agglomeration temperature zone, i.e., 1100–1010° C. was kept to be 1.9° C./min, which satisfies a condition for an intended defect size.

The mirror polished silicon wafer obtained from the crystal was measured by observing the surface thereof with the TEM to determine the defect size. As a result, the defect size was large as about 80 nm on the average.

Furthermore, the wafer was subjected to heat treatment for eliminating defects (at 1200° C. for an hour, in an atmosphere of argon gas), and the surface of the wafer was observed. As a result, many of defects remained on the wafer without eliminating. The test conditions and results are shown together in Table 1. This result is different from an initial intent to obtain defects having a size of about 60 nm.

Thereafter, a cooling rate of the crystal in the agglomeration temperature zone with adding nitrogen was determined. The resultant value was 1.3° C./min, which reveals that the crystal was cooled gradually in the agglomeration temperature zone.

The present invention is not limited to the embodiments described above. The above-described embodiments are mere examples, and those having the substantially same structure as that described in the appended claims and providing the similar functions and advantages are included in the scope of the present invention.

For example, the above embodiments are described while mentioning the growth of a silicon single crystal having a diameter of 6 inches. However, the present invention is not limited thereto. The present invention may be applied to the growth of a silicon single crystal having a diameter of 8 to 16 inches or larger.

Further, the method of the present invention can be applied not only for a Czochralski method but also for so-called MCZ method in which horizontal magnetic field, vertical magnetic field, cusp magnetic field, or the like is applied to the silicon melt.

What is claimed is:

1. A method for producing a silicon single crystal in accordance with a Czochralski method, wherein before producing the crystal to be produced having a kind and concentration of impurity, another silicon single crystal having the same kind and concentration of impurity as the crystal to be produced is grown to thereby determine an agglomeration temperature zone of grown-in defects thereof, and then based on the temperature, a cooling rate of the crystal to be produced for passing through the agglomeration temperature zone is adjusted by growth condition of the crystal to be produced or temperature distribution within a furnace of a pulling apparatus thereby to produce the silicon single crystal.

2. The method for producing a silicon single crystal according to claim 1, wherein the kind and concentration of the impurity is at least nitrogen and concentration thereof.

3. The method for producing a silicon single crystal according to claim 1, wherein the average cooling rate of the crystal for passing through the agglomeration temperature zone of grown-in defects is 1.6° C./min or more.

4. The method for producing a silicon single crystal according to claim 1, wherein the average cooling rate of the crystal for passing through the agglomeration temperature zone of grown-in defects is 1.0° C./min or less.

5. A silicon single crystal produced in accordance with the method according to claim 1, wherein a density of LSTD before subjecting to heat treatment is 500 number/cm$^2$ or more.

6. A silicon wafer produced from the silicon single crystal according to claim 5, wherein the wafer was subjected to heat treatment in an atmosphere of non-oxidizing gas.

7. A silicon single crystal produced in accordance with the method according to claim 1, wherein the average size of grown-in defect is 70 nm or less.

8. A silicon wafer produced from the silicon single crystal according to claim 7, wherein the wafer was subjected to heat treatment in an atmosphere of non-oxidizing gas.

9. A method for producing a silicon single crystal in which nitrogen is added as impurity, wherein an agglomeration temperature zone of grown-in defects of the crystal in which nitrogen concentration is in the range of $0.1 \times 10^{13}$ to $8.0 \times 10^{13}/cm^3$ is assumed to shift by $-50°$ C. in the high temperature limit and by $-20°$ C. in the low temperature limit respectively from an agglomeration temperature zone in a case that nitrogen is not added, and then a cooling rate of the crystal to be produced for passing through the agglomeration temperature zone is adjusted by growth condition of the crystal to be produced or temperature distribution within a furnace of a pulling apparatus thereby to produce the silicon single crystal.

10. The method for producing a silicon single crystal according to claim 9, wherein the average cooling rate of the crystal for passing through the agglomeration temperature zone of grown-in defects is 1.6° C./min or more.

11. The method for producing a silicon single crystal according to claim 9, wherein the average cooling rate of the crystal for passing through the agglomeration temperature zone of grown-in defects is 1.0° C./min or less.

12. A silicon single crystal produced in accordance with the method according to claim 9, wherein a density of LSTD before subjecting to heat treatment is 500 number/cm$^2$ or more.

13. A silicon wafer produced from the silicon single crystal according to claim 12, wherein the wafer was subjected to heat treatment in an atmosphere of non-oxidizing gas.

14. A silicon single crystal produced in accordance with the method according to claim 9, wherein the average size of grown-in defect is 70 nm or less.

15. A silicon wafer produced from the silicon single crystal according to claim 14, wherein the wafer was subjected to heat treatment in an atmosphere of non-oxidizing gas.

* * * * *